United States Patent [19]
Lewis et al.

[11] Patent Number: 5,995,440
[45] Date of Patent: Nov. 30, 1999

[54] OFF-CHIP DRIVER AND RECEIVER CIRCUITS FOR MULTIPLE VOLTAGE LEVEL DRAMS

[75] Inventors: Scott C. Lewis, Essex Junction; Thomas M. Maffitt, Burlington, both of Vt.

[73] Assignee: International Business Machines Corporation, Armonk, N.Y.

[21] Appl. No.: 09/121,499

[22] Filed: Jul. 23, 1998

[51] Int. Cl.⁶ .................................................. G11C 8/00
[52] U.S. Cl. ................ 365/230.06; 365/226; 365/185.23
[58] Field of Search ............... 365/230.06, 226, 365/185.23

[56] References Cited

U.S. PATENT DOCUMENTS

| | | | |
|---|---|---|---|
| 4,719,372 | 1/1988 | Chappell et al. | 307/475 |
| 5,021,684 | 6/1991 | Ahuja et al. | 307/443 |
| 5,066,873 | 11/1991 | Chan et al. | 307/447 |
| 5,469,082 | 11/1995 | Bullinger et al. | 326/81 |
| 5,479,123 | 12/1995 | Gist et al. | 327/108 |
| 5,541,534 | 7/1996 | Cao et al. | 326/81 |
| 5,663,663 | 9/1997 | Cao et al. | 326/81 |
| 5,815,354 | 9/1998 | Braceras et al. | 361/56 |
| 5,818,781 | 10/1998 | Estakhri et al. | 365/226 |

Primary Examiner—David Nelms
Assistant Examiner—VanThu Nguyen
Attorney, Agent, or Firm—John J. Goodwin

[57] ABSTRACT

Off-chip driver and receiver circuits for multiple level memory applications including a voltage sensing circuit that provides an output voltage adjust signal having different voltage levels corresponding to different external voltage levels of the memory circuit. The off-chip driver circuit is connected to the voltage adjust signal and has an output signal transition slew rate that varies in response to the voltage level of the voltage adjust signal. The circuit is also connected to the voltage adjust signal and includes a filter circuit having a time constant that adjusts the noise immunity of the receiver in response to the voltage level of the voltage adjust signal.

6 Claims, 4 Drawing Sheets

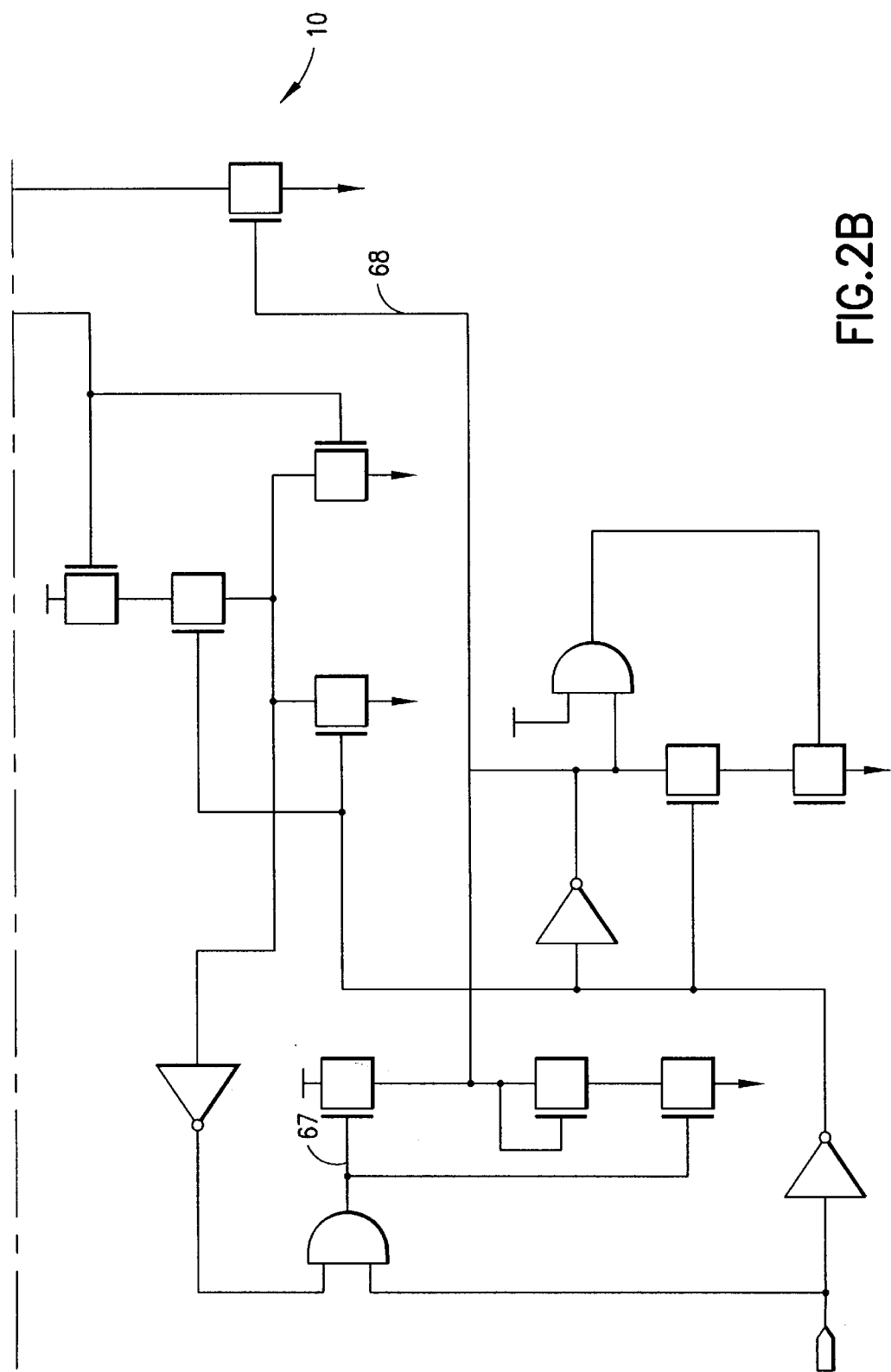

OFF-CHIP DRIVER AND RECEIVER CIRCUITS FOR MULTIPLE VOLTAGE LEVEL DRAMS

BACKGROUND OF THE INVENTION

1. Field of the Invention

The present invention relates to interface circuits for dynamic random access memory circuits (DRAMs), and more particularly to off-chip driver (OCD) and receiver circuits for multiple voltage level DRAM circuits.

2. Background Art

DRAMs that operate with multiple voltage levels, such as 5 volt and 3 volt parts, use a different metal level for each voltage. The base design of the DRAM is thus "personalized" and the off-chip driver and receiver circuits are optimized for their respective voltage of operation, for example, in either a 3 volt or a 5 volt environment.

The personalization fabrication mask and the resulting two voltage parts must be managed through wafer and module build and test. This results in increased complexity and cost. An omission of the personalization masks reduces the complexity and cost, but results in a non-optimum design point for either or both of the 3 volt or 5 volt off-chip drivers and receivers.

The following U.S. patents represent typical background references related to the present invention.

U.S. Pat. No. 5,663,663 issued Sep. 2, 1997 to Cao et al. entitled MIXED VOLTAGE INTERFACE CONVERTER.

U.S. Pat. No. 5,479,123 issued Dec. 26, 1995 to Gist et al. entitled EXTERNALLY PROGRAMMABLE INTEGRATED BUS TERMINATOR FOR OPTIMIZING SYSTEM BUS PERFORMANCE.

U.S. Pat. No. 5,469,082 issued Nov. 21, 1995 to Bullinger et al. entitled PERIPHERAL COMPONENT INTERFACING SYSTEM WITH BUS VOLTAGE/LOGIC SUPPLY COMPARISON MEANS.

U.S. Pat. No. 5,066,873 issued Nov. 19, 1991 to Chan et al. entitled INTEGRATED CIRCUITS WITH REDUCED SWITCHING NOISE.

U.S. Pat. No. 5,021,684 issued Jun. 4, 1991 to Ahuja et al. entitled PROCESS SUPPLY, TEMPERATURE COMPENSATING CMOS OUTPUT BUFFER.

U.S. Pat. No. 4,719,372 issued Jan. 12, 1988 to Chappell et al. entitled MULTIPLYING INTERFACE CIRCUIT FOR LEVEL SHIFTING BETWEEN FET AND TTL LEVELS.

SUMMARY OF THE INVENTION

An object of the present invention is to provide off-chip driver (OCD) and receiver interface circuits for multiple voltage level memories having performance optimized for each voltage level.

Another object of the present invention is to provide optimized OCD and receiver circuits having different performance and noise immunity design points for each voltage in a multiple voltage level memory environment.

A further object of the present invention is to provide an OCD and receiver circuit for multiple voltage level memories that includes a voltage sensing circuit that generates an adjust signal in response to operating voltage levels.

Still another object of the present invention is to provide OCD and receiver circuits for multiple voltage level memories that do not require personalization masks during fabrication.

Yet another object of the present invention is to provide a voltage sensing circuit for a multiple level memory structure that generates an adjust signal that adjusts the slew rate of transitions from an OCD circuit.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DESCRIPTION OF THE INVENTION

Figure 1:
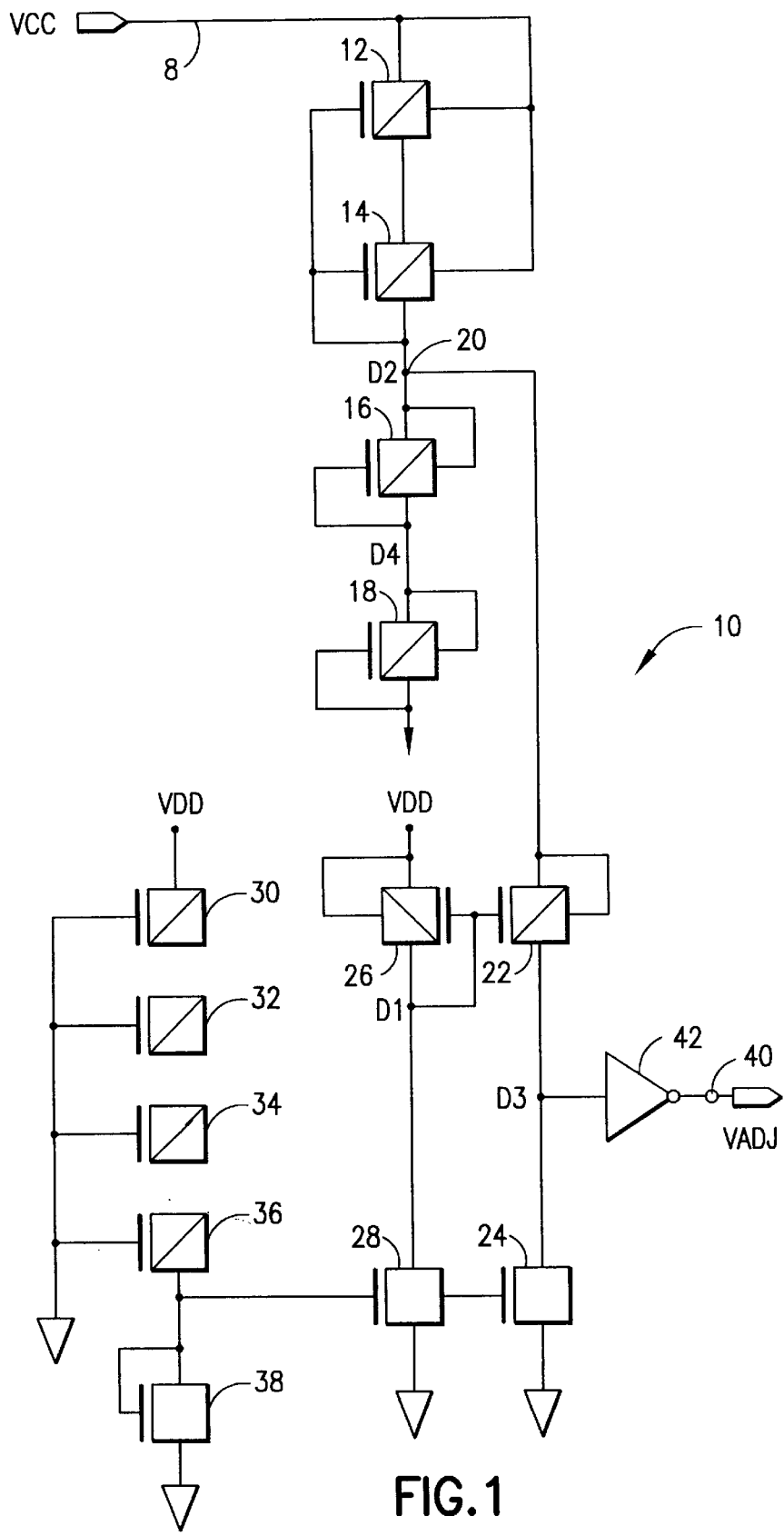
FIG. 1 is a schematic illustration of an embodiment of a voltage sensing circuit according to the principles of the present invention.

Referring to FIG. 1, an embodiment of a voltage sensing circuit is shown that is disposed on a memory chip and generates an adjust signal in response to different operating voltage levels of the memory circuit. For example, in an embodiment with operating voltage levels of 3 volts and 5 volts, referred to as the 3 volt and 5 volt parts, the adjust signal functions to increase the memory circuit slew rate for the 3 volt part.

The adjust signal from the voltage sensing circuit also serves to decrease the noise filter of a receiver on the memory chip connected thereto and lowers the DC trip point of the receiver for a 3 volt part.

More particularly, the voltage sensing circuit 10 shown in FIG. 1 detects the external voltage VCC applied to the memory chip at input terminal 8 and generates an output adjust signal VADJ. In the present embodiment, the applied external voltage VCC is either 3 volts or 5 volts with the internal voltage VDD regulated to 2.5 volts for both the 3 volt and 5 volt parts.

Voltage sensing circuit 10 includes a first pair of transistor devices 12 and 14 connected to VCC and a second pair of transistor devices 16 and 18 connected to transistors 12 and 14 at node 20. It is possible that a single device could be used in place of devices 12 and 14.

A third pair of transistor devices 22 and 24 are connected to node 20 and a fourth pair of transistor devices 26 and 28 are connected to transistors 22 and 24. Transistor devices 30, 32, 34, and 36 and transistor device 38 connected to transistor 36 serve to form a bias circuit that sets a small leakage current through devices 28 and 24. Devices 12, 14, 16, and 18 form a voltage divider that establishes a voltage at D2. The voltage at D1 is equal to VDD (i.e. 2.5 volts) minus the threshold voltage VT of device 26. When VCC is above 4.0 volts, the voltage divider sets the voltage at D2 at a point above VDD-Vt, consequently device 22 turns on and overcomes the leakage current through device 24, which in turn causes the voltage at node D3 to rise, flipping the state of inverter 42 and the state of VADJ to low.

When VCC is less than 4.0 volts, the voltage at D2 is less than VDD-Vt and device 22 turns off. Device 24 pulls D3 to 0 volts, flipping the inverter and the state of VADJ to high. Thus, VADJ is low if VCC is above 4.0 volts and high if VCC is below 4.0 volts. The output adjust signal VADJ is obtained at node 40 via circuit 42. In FIG. 1, a single device could be used in place of devices 30,32, 34, and 36 with its back bias connected to VDD.

Voltage sensing circuit 10 senses the VCC voltage and generates a low (zero volts) output adjust signal VADJ for VCC voltage greater than or approximately 4 volts and a high (VDD or 2.5 volts) output adjust signal VADJ for VCC voltage less than 4 volts. Application voltage conditions are usually plus and minus 10 percent. This makes the normal operating range 5.5 volts to 4.5 volts so consequently a 5 volt part of the circuit chip will be operated no lower than 4.5 volts. A 3 volt part (3.3 volts) of the circuit chip will operate in the range 3.0 volts to 3.6 volts and consequently will operate no higher than 3.6 volts. The voltage sensing circuit 10 is set to generate one state for VCC less than 4.0 volts and the opposite state for VCC greater than 4.0 volts. As a result, with the lower end of the operating range of the 5 volt part at 4.5 volts and the upper operating range of the 3.3 volt part at 3.6 volts, a 4 volt "break point" is the midpoint between the two operating regions, assuring that the voltage sensing circuit will recognize a 3 volt vs. a 5 volt part in all operating conditions. Even when tester tolerances and noise plus chip process variations are considered, a 4 volt break point is more than adequate to assure that voltage sensing circuit 10 will set.output adjust signal VADJ to its respective correct state for a 3 volt and a 5 volt part of the circuit chip.

Figure 2A:
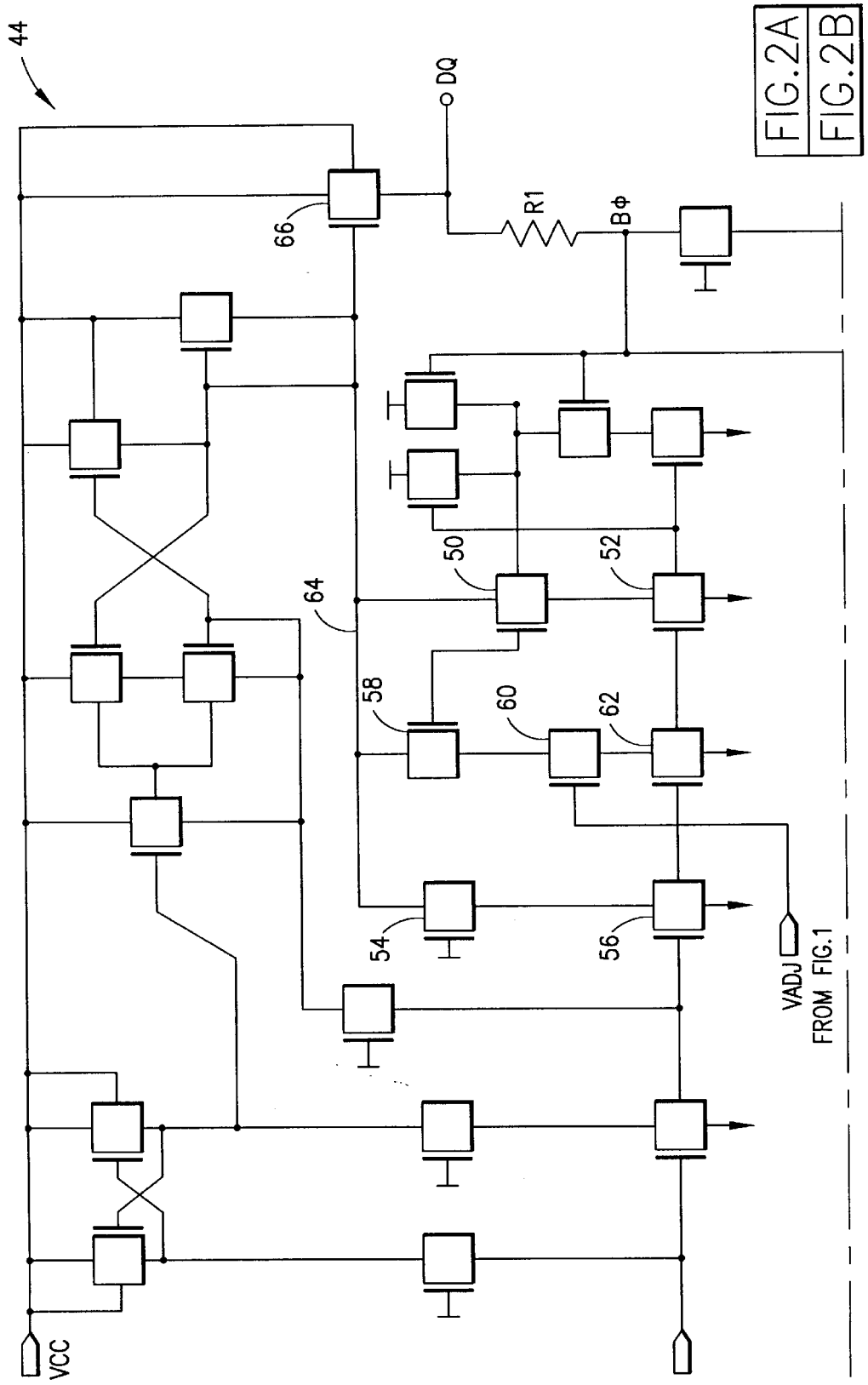
FIG. 2 is a schematic illustration of an embodiment of an embodiment of an OCD circuit according to the principles of the present invention.

Referring to FIG. 2, an embodiment of an OCD circuit 44 is shown connected to the output adjust signal VADJ from the voltage sensing circuit 10 of FIG. 1. The adjust signal VADJ is used to adjust the performance of the OCD circuit 44 of FIG. 2 based on the state of VADJ. In the present embodiment, the slew rate of the output transition from a low level ("0") to a high level ("1") is faster for the 3 volt circuit chip part than for the 5 volt circuit chip part. In the present embodiment, for a 5 volt part the low level (Vil) is defined as 1.0 volts and the high level (Vih) is defined as 2.4 volts. The faster slew rate transition from low level to high level for the 3 volt part is accomplished by activating the current path formed by transistor devices 58, 60 and 62 when adjust signal VADJ is high in the 3 volt case. This additional path, parallel to the paths formed by transistor devices 50 and 52 and 54 and 56, sets the gate voltage on lead 64 of the large P-FET pull-up device 66 lower than in the 5 volt case. Consequently, P-FET device 66 is turned on harder, decreasing the slew rate (i.e. making it faster) for the 3 volt part output of a "1". The slew rate is Dv/Dt, that is, the change in voltage per change in time. A higher slew rate implies a greater change in voltage per unit time, which is faster. Thus an increased slew rate increases performance, and vice versa. For the 5 volt circuit chip part, the adjust signal VADJ is low, turning off the current path through transistors 58, 60 and 62, which in turn raises the voltage on gate voltage lead 64 and reducing the drive on P-FET transistor 66. This slows the low to high transition of data driven from the OCD and produces a greater slew rate. A slower 5 volt "1" transition is desirable since it reduces noise generated by the large delta V required by the circuit to transition from 0 volts to 5.5 volts (Vcc plus 10 percent).

The slower "1" slew rate however, is not a performance limiter since a "1" transition is from 0 volts to 2.4 volts, which is a delta V of only 2.4 volts, which is faster than a "0" transition from 5.5 volts to 0.6 volts, a delta of 4.9 volts.

If desired, the "0" slew rate could also be slowed for a 5 volt vs a 3 volt design for additional noise reduction at the expense of some performance. In such embodiment, the adjust signal VADJ, with appropriate logic devices, would be added to the logic that controls the gate voltage on the lead 68 of the pulldown devices 70. As with the pullup portion of the OCD, a low adjust signal VADJ would reduce the drive to the pulldown devices 70, increasing the slew rate which reduces both performance and noise.

Figure 3:
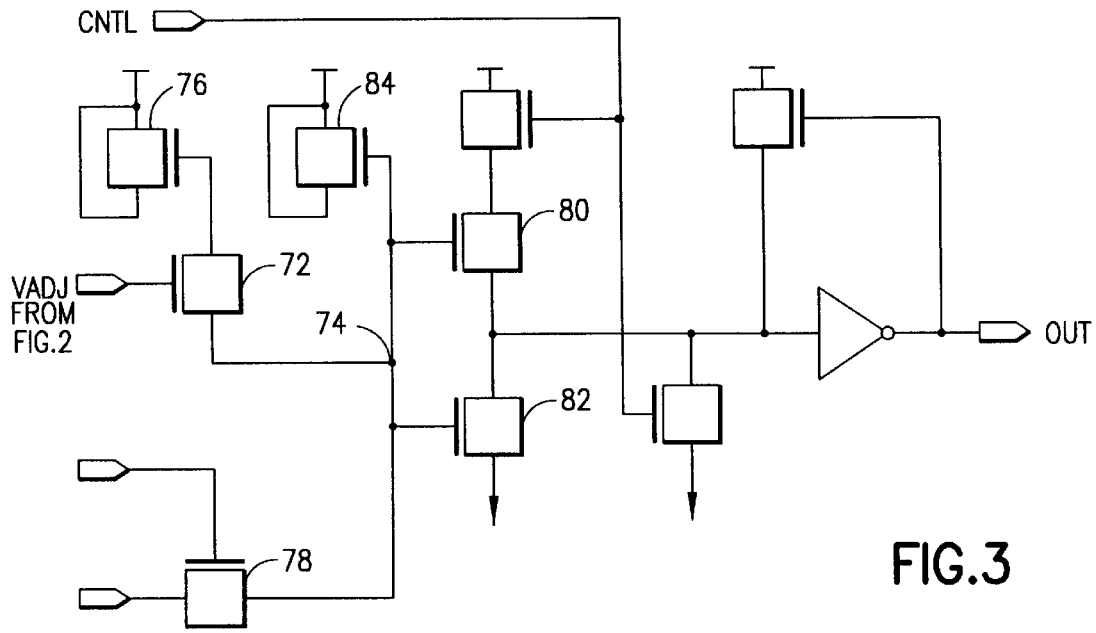
FIG. 3 is a schematic illustration of an embodiment of a receiver circuit according to the principles of the present invention.

Referring to FIG. 3, an embodiment of a receiver is illustrated that provides an example of the way the adjust signal VADJ may be used to adjust the noise immunity of the receiver. In FIG. 3, a P-FET transistor 72 is gated by the adjust signal VADJ from FIG. 1. P-FET transistor 72 is connected between node 74 and a P-FET capacitor 76. In the 5 volt case, when adjust signal VADJ is low, the capacitance of P-FET capacitor 76 is added to node 74. This additional capacitance is desirable for the 5 volt part, since receiver inputs that may transition from 0 volts to 5 volts are more likely to have slope reversals. For the 3 volt part, the adjust signal VADJ is high, consequently the capacitance of P-FET capacitor 76 is not seen by node 74. This reduces the time constant of the filter portion of the receiver that consists of devices 76, 72, 84 and 78. The filter portion of FIG. 3 is an RC filter, with device 78 providing resistance from the input INX to the inverter that is formed by devices 80 and 82 and capacitance from devices 76 and 84. The capacitance of device 76 is added when VADJ is low in the 5 volt part.

The reduction of the time constant of the filter portion increases performance at the expense of noise immunity. This is a desirable compromise for the 3 volt part because the 0 volt to 3 volt transitions will have less noise than the 5 volt delta V of a 5 volt part. As a result, the performance of the 3 volt receiver can be improved without compromising the part's relative noise immunity.

Figure 4:
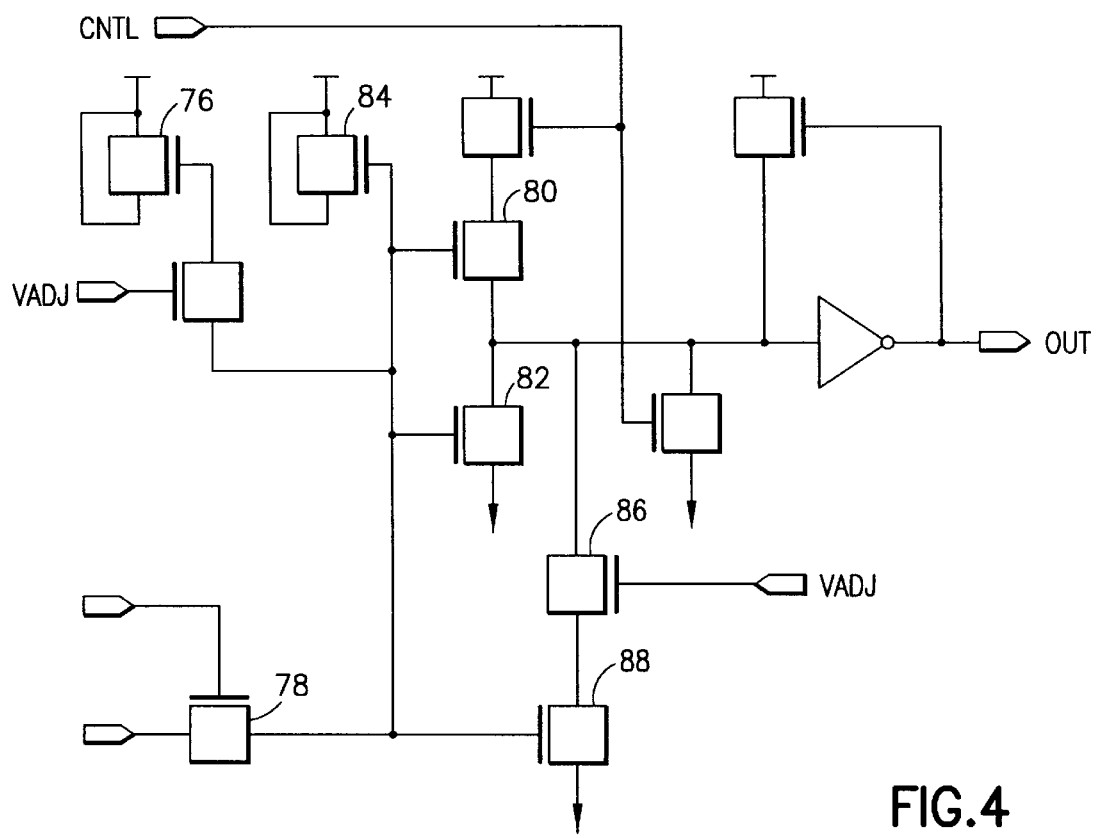
FIG. 4 is a schematic illustration of another embodiment of a receiver circuit with variable input characteristics and trip point according to the principles of the present invention.

It may also be desirable to have a different DC trip point for the 5 volt and the 3 volt receiver parts. In the embodiment illustrated in FIG. 4, transistor devices 86 and 88 are added, with transistor device 86 gated by the adjust signal VADJ. Consequentially, for the 3 volt part adjust signal VADJ is high, which sets the 3 volt DC trip point of the receiver 3 volt part lower than in the 5 volt part. For the 5 volt part the converse is true and the DC trip point moves higher. This is desirable since the 5 volt part is operating with Transistor-Transistor-Logic (TTL) levels of 2.4 to 0.8 volts and the 3 volt part with LVTTL levels of 2.0 to 0.8 volts. The center point of operation for the 5 volt TTL part is higher, consequently the receiver needs to be adjusted accordingly.

What has been described is a multiple voltage level DRAM wherein the OCD and receiver performance is optimized for each voltage level in the multiple voltage level by an adjust signal from a voltage sensing circuit. The voltage sensing circuit detects the multiple level operating voltage, for example 3 volts or 5 volts and generated an adjust signal VADJ. The VADJ adjust signal increases the 3 volt slew rate and provides a faster OCD than for the 5 volt part. The adjust signal also decreases the 3 volt receiver noise filter and/or lowers the DC trip point for LVTTL vs 5 volt TTL operation.

The described invention provides the advantage that different 3 volt and 5 volt performance and noise restrictions of a circuit are met by one design and 3 volt OCD/receiver performance is not penalized by 5 volt noise restrictions. Furthermore, the voltage sensing circuit and the OCD design eliminates the need for a personalization mask, thus the additional cost and manufacturing complexity of a mask is eliminated.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

We claim:

1. A multiple voltage level memory circuit comprising a voltage sensing circuit disposed on a memory chip for providing an output adjust signal having different voltage levels in response to and representative of different external voltage levels from the memory circuit, the multiple voltage level memory circuit including an off-chip driver (OCD) circuit connected to the voltage sensing circuit and responsive to the output adjust signal, the OCD circuit having an output signal transition slew rate that varies in response to the voltage level of the adjust signal.

2. A multiple voltage level memory circuit comprising a voltage sensing circuit disposed on a memory chip for providing an output adjust signal having different voltage levels in response to and representative of different external voltage levels from the memory circuit, the multiple voltage level memory circuit, the multiple voltage level memory circuit including a receiver circuit connected to the voltage sensing circuit and responsive to the output adjust signal for adjusting the noise immunity of the receiver, the receiver circuit including a filter means responsive to the adjust signal wherein the adjust signal changes the time constant of the filter means to adjust the noise immunity of the receiver.

3. The multiple voltage level memory circuit according to claim 1 wherein the voltage sensing circuit includes a first transistor voltage divider means connected to the external voltage level from the memory circuit that provides a first level state of the adjust signal when the external voltage level is greater than a given bias level and a second level state of the adjust signal when the external voltage level from the memory circuit is less than the given bias level.

4. The multiple level memory circuit according to claim 1 wherein the OCD circuit includes a pullup transistor device, and a plurality of transistor devices connected to the voltage sensing circuit and responsive to the voltage level of the adjust signal to form a current path that sets the gate voltage of the pullup transistor device to vary the output signal slew rate.

5. The multiple voltage level memory circuit according to claim 2 wherein the filter means includes a plurality of transistor devices connected to form an RC filter having a given time constant, and wherein the voltage level of the adjust signal adjusts the capacitance of the RC filter to vary the time constant of the RC filter to adjust the receiver immunity.

6. The multiple voltage level memory circuit according to claim 2 wherein the receiver circuit has a given DC trip point and wherein the receiver circuit further includes a transistor means connected to and gated by the adjust signal from the voltage sensing circuit to set the receiver DC trip point to different levels in response to and representative of the external voltage levels from the memory circuit.

* * * * *